United States Patent
Lin et al.

(10) Patent No.: US 6,444,587 B1
(45) Date of Patent: Sep. 3, 2002

(54) PLASMA ETCH METHOD INCORPORATING INERT GAS PURGE

(75) Inventors: Mu-Tsang Lin; Pin-Yi Hsin, both of Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 09/677,531

(22) Filed: Oct. 2, 2000

(51) Int. Cl.⁷ ............................................. H01L 21/302
(52) U.S. Cl. ...................... 438/714; 438/719; 438/721
(58) Field of Search .................. 438/710, 712, 438/714, 719, 721; 216/79, 67

(56) References Cited

U.S. PATENT DOCUMENTS

| | | | |
|---|---|---|---|
| 4,657,620 A | | 4/1987 | Davis et al. ................. 156/345 |
| 5,854,137 A | * | 12/1998 | Kuo ............................. 438/710 |
| 5,869,401 A | | 2/1999 | Brunemeier et al. ........ 438/710 |
| 5,924,000 A | | 7/1999 | Linliu ......................... 438/592 |
| 6,001,727 A | * | 12/1999 | Ohmi et al. ................. 438/618 |
| 6,143,040 A | * | 11/2000 | Tometsuka et al. ......... 118/719 |
| 6,153,530 A | * | 11/2000 | Ye et al. ..................... 438/720 |
| 6,306,770 B1 | * | 10/2001 | Ito et al. ..................... 156/345 |

* cited by examiner

*Primary Examiner*—Benjamin L. Utech
*Assistant Examiner*—Kin-Chan Chen
(74) *Attorney, Agent, or Firm*—Tung & Associates

(57) ABSTRACT

Within a method for forming a plasma etched layer, there is first provided a substrate. There is then formed over the substrate a microelectronic layer. There is then etched within a plasma reactor chamber, and while employing a plasma etch method, the microelectronic layer to form a plasma etched microelectronic layer. Finally, there is then purged the plasma reactor chamber with an inert purge gas, without subsequently evacuating the plasma reactor chamber, prior to removing the substrate having formed thereover the plasma etched microelectronic layer from the plasma reactor chamber. In an alternative there is purged a load lock chamber integral to the plasma reactor chamber with an inert purge gas, without subsequently evacuating the load lock chamber, prior to removing the substrate having formed thereover the plasma etched microelectronic layer from the load lock chamber.

8 Claims, 1 Drawing Sheet

PLASMA ETCH METHOD INCORPORATING INERT GAS PURGE

BACKGROUND OF THE INVENTION

1. Field of the Invention

The present invention relates generally to plasma etch methods for forming plasma etched layers within microelectronic fabrications. More particularly, the present invention relates to plasma etch methods for forming, with attenuated residue, plasma etched layers within microelectronic fabrications

2. Description of the Related Art

Microelectronic fabrications are formed from microelectronic substrates over which are formed patterned microelectronic conductor layers which are separated by microelectronic dielectric layers.

Common in the art of microelectronic fabrication, for use when fabricating microelectronic fabrications, is the use of plasma etch methods. Such plasma etch methods employ etchant gas compositions which assist in forming from blanket microelectronic layers within microelectronic fabrications plasma etched microelectronic layers within microelectronic fabrications. More typically and preferably, such plasma etch methods employ etchant gas compositions which assist in forming from blanket microelectronic layers within microelectronic fabrications plasma etched patterned microelectronic layers within microelectronic fabrications.

While plasma etch methods are thus desirable and often essential within the art of microelectronic fabrication for fabricating microelectronic fabrications, plasma etch methods are nonetheless not entirely without problems within the art of microelectronic fabrication when fabricating microelectronic fabrications. In that regard, plasma etch methods, and in particular plasma etch methods which employ corrosive etchant gas compositions, such as but not limited to corrosive halogen containing etchant gas compositions such as but not limited to chlorine containing etchant gas compositions and bromine containing etchant gas compositions, often provide when fabricating microelectronic fabrications plasma etched microelectronic layers which suffer from enhanced detrimental residue formation.

It is thus towards the goal of providing for use within the art of microelectronic fabrication when fabricating microelectronic fabrications plasma etch methods which provide plasma etched layers with attenuated residue that the present invention is directed.

Various plasma etch methods having desirable properties and plasma processing apparatus having desirable properties have been disclosed in the art of microelectronic fabrication.

For example, Davis et al., in U.S. Pat. No. 4,657,620, disclose a plasma processing apparatus which provides for enhanced plasma process flexibility and enhanced plasma process uniformity when plasma processing a microelectronic layer within a microelectronic fabrication while employing the plasma processing apparatus. In order to realize the foregoing results, the plasma processing apparatus employs integral with a plasma reactor chamber which comprises the plasma processing apparatus an entry load lock chamber of the plasma processing apparatus and an exit load lock chamber of the plasma processing apparatus, each of which is independently powered such as to allow for either or both of a preprocessing of the microelectronic layer within the entry load lock chamber of the plasma processing apparatus and a post processing of the microelectronic layer within the exit load lock chamber of the plasma processing apparatus, in conjunction with the plasma processing of the microelectronic layer within the plasma reactor chamber of the plasma processing apparatus.

In addition, Kuo in U.S. Pat. No. 5,854,137, discloses a plasma etch method for forming from a blanket polycide layer within a microelectronic fabrication a patterned polycide layer within the microelectronic fabrication, while employing within the plasma etch method a series of etchant gas compositions which in an aggregate comprise sulfur hexafluoride, hydrogen bromide and oxygen, and while attenuating formation of a residue upon the patterned polycide layer which is plasma etched from the blanket polycide layer. In order to realize the foregoing result, the plasma etch method employs a purging of a plasma reactor chamber within which is practiced the plasma etch method with an inert gas subsequent to etching while employing the plasma etch method the blanket polycide layer to form the patterned polycide layer, wherein subsequent to purging the plasma reactor chamber with the inert gas the plasma reactor chamber is evacuated.

Further Brunemeier et al., in U.S. Pat. No. 5,869,401, disclose a plasma processing method for removing from at least either a plasma reactor chamber or a plasma processed microelectronic fabrication which has been plasma processed within the plasma reactor chamber corrosive species which might otherwise contribute to formation of a corrosive residue within the plasma reactor chamber or upon the plasma processed microelectronic fabrication. In order to realize the foregoing result, the plasma processing method employs an oxygen containing plasma for scavenging residual corrosive species from within the plasma reactor chamber or from upon the plasma processed microelectronic fabrication after having formed the plasma processed microelectronic fabrication while employing the plasma processing method.

Finally, Linliu in U.S. Pat. No. 5,924,000 discloses a plasma etch method for forming over a topographic substrate within a microelectronic fabrication a residue free patterned polysilicon containing microelectronic layer through plasma etching of a blanket polysilicon containing microelectronic layer formed over the topographic substrate within the microelectronic fabrication. In order to realize the foregoing result, the plasma etch method comprises a two-step sequential plasma etch method employing: (1) a first plasma employing a first etchant gas composition comprising a chlorine containing etchant species for etching the blanket polysilicon containing microelectronic layer to form the patterned polysilicon containing microelectronic layer and a patterned polysilicon containing layer residue each formed over the topographic substrate; and (2) a second plasma employing a second etchant gas composition comprising an oxygen containing etchant species and a bromine containing etchant species for etching the patterned polysilicon containing layer residue from over the topographic substrate employed within the microelectronic fabrication.

Desirable in the art of microelectronic fabrication are additional plasma etch methods which provide plasma etched layers with attenuated residue.

It is towards the foregoing object that the present invention is directed.

SUMMARY OF THE INVENTION

A first object of the present invention is to provide a plasma etch method for plasma etching a microelectronic layer within a microelectronic fabrication to form a plasma etched microelectronic layer within the microelectronic fabrication.

A second object of the present invention is to provide a plasma etch method in accord with the first object of the present invention, where the plasma etch method provides the plasma etched microelectronic layer with attenuated residue.

A third object of the present invention is to provide a plasma etch method in accord with the first object of the present invention and the second object of the present invention, which method is readily commercially implemented.

In accord with the objects of the present invention, there is provided by the present invention a plasma etch method for forming a plasma etched microelectronic layer. To practice the present invention, there is first provided a substrate. There is then formed over the substrate a microelectronic layer. There is then etched within a plasma reactor chamber, and while employing a plasma etch method, the microelectronic layer to form a plasma etched microelectronic layer. Finally, there is then purged the plasma reactor chamber with an inert purge gas, without subsequently evacuating the plasma reactor chamber, prior to removing the substrate from the plasma reactor chamber.

The method of the present invention may alternatively be employed within the context of purging a load lock chamber which is integral with the plasma reactor chamber, rather than purging the plasma reactor chamber, prior to removing from the load lock chamber the substrate having formed thereover the plasma etched microelectronic layer.

There is provided by the present invention a plasma etch method for forming from a microelectronic layer within a microelectronic fabrication a plasma etched microelectronic layer, where the plasma etched microelectronic layer is formed with an attenuated residue. The present invention realizes the foregoing result by employing subsequent to plasma etching within a plasma reactor chamber a microelectronic layer formed over a substrate to form a plasma etched microelectronic layer formed over the substrate a purging of the plasma reactor chamber or a load lock chamber integral to the plasma reactor chamber, without subsequently evacuating the plasma reactor chamber or the load lock chamber integral to the plasma reactor chamber, prior to removing from the plasma reactor chamber or the load lock chamber integral to the plasma reactor chamber the substrate having formed thereover the plasma etched microelectronic layer.

The method of the present invention is readily commercially implemented. The present invention employs methods and materials which are generally known in the art of microelectronic fabrication but employed within the context of a specific ordering to provide the present invention. Since it is a novel ordering of methods and materials which provides at least in part the present invention, rather than the existence of methods and materials which provides the present invention, the method of the present invention is readily commercially implemented.

BRIEF DESCRIPTION OF THE DRAWING

The objects, features and advantages of the present invention are understood within the context of the Description of the Preferred Embodiment, as set forth below. The Description of the Preferred Embodiment is understood within the context of the accompanying drawing, which forms a material part of this disclosure, wherein.

DESCRIPTION OF THE PREFERRED EMBODIMENT

Figure 1:
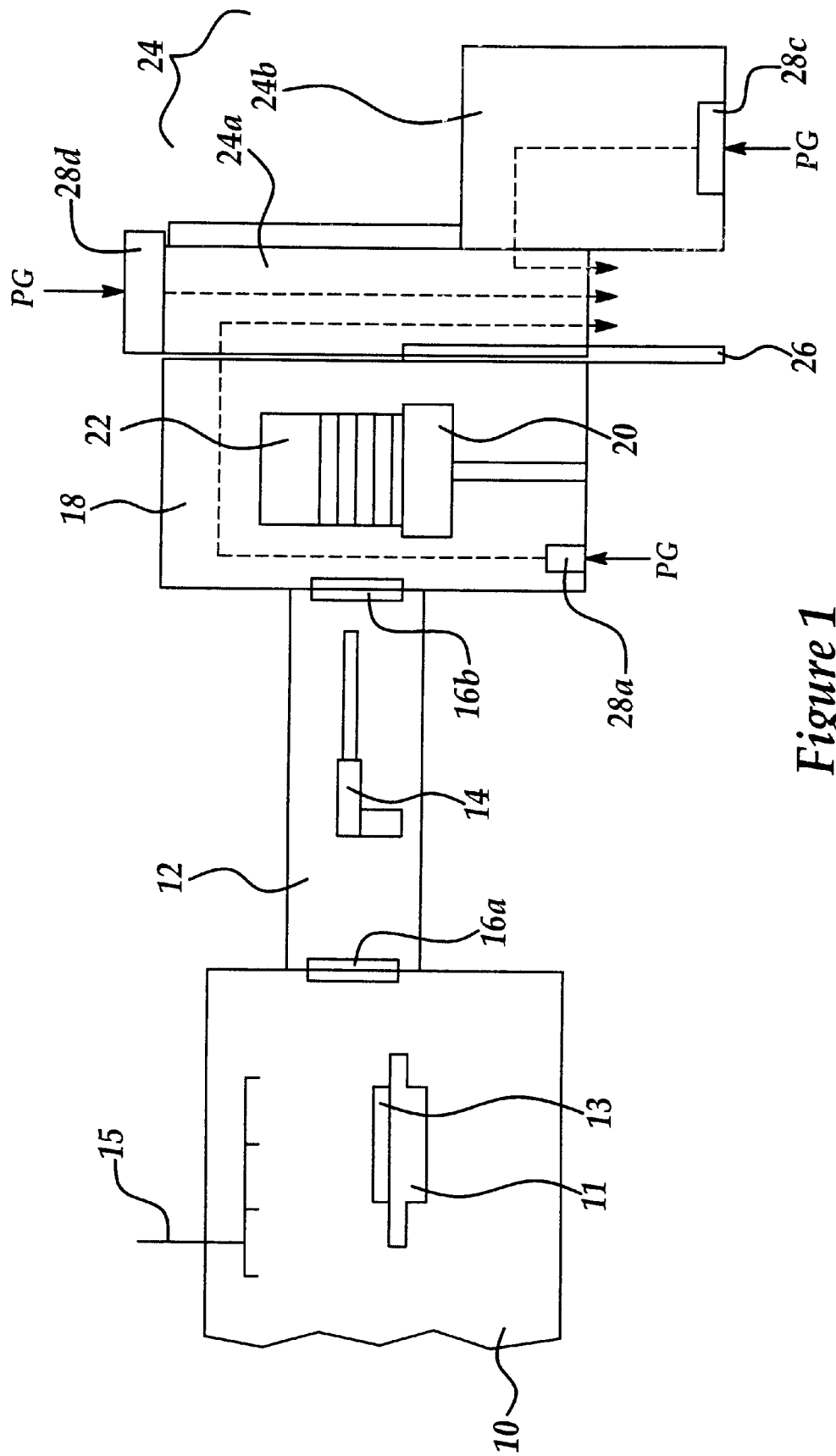
FIG. 1 shows a schematic diagram of a plasma reactor apparatus in accord with the present invention.

There is provided by the present invention a plasma etch method for forming from a microelectronic layer within a microelectronic fabrication a plasma etched microelectronic layer within the microelectronic fabrication, where the plasma etched microelectronic layer is formed with attenuated residue. The present invention realizes the foregoing result by employing subsequent to plasma etching a microelectronic layer formed over a substrate to form a plasma etched microelectronic layer formed over the substrate within a plasma reactor chamber a purging of the plasma reactor chamber or a load lock chamber integral to the plasma reactor chamber, without subsequently evacuating the plasma reactor chamber or the load lock chamber integral to the plasma reactor chamber, prior to removing from the plasma reactor chamber or the load lock chamber integral to the plasma reactor chamber the substrate having formed thereover the plasma etched microelectronic layer.

As suggested above, while the preferred embodiment of the present invention illustrates the present invention within the context of providing an inert purge gas flow within a load lock chamber of a plasma reactor apparatus in order to provide for attenuated residue formation upon a plasma etched microelectronic layer formed over a substrate, where the plasma etched microelectronic layer is plasma etched within a plasma reactor chamber which is integral with the load lock chamber within the plasma reactor apparatus, the present invention may also be employed in providing for attenuated residue upon the plasma etched microelectronic layer by means of purging a plasma reactor chamber in accord with the method of the present invention, particularly under circumstances where the plasma reactor chamber does not have integral thereto a load lock chamber.

Similarly, although the preferred embodiment of the present invention discloses the present invention within the context of providing attenuated residue formed upon an etched silicon containing microelectronic layer formed over a substrate employed within a microelectronic fabrication, the method of the present invention may alternatively be employed, with varying degrees of efficacy, in providing for attenuated residue formation upon plasma etched microelectronic layers including but not limited to plasma etched microelectronic conductor layers, plasma etched microelectronic semiconductor layers and plasma etched microelectronic dielectric layers.

Finally, as is understood by a person skilled in the art, the method of the present invention may be employed for forming with attenuated residue plasma etched microelectronic layers formed over substrates employed within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring now to FIG. 1, there is shown a schematic diagram of a plasma reactor apparatus within which may be practiced the method of the present invention.

Shown in FIG. 1, in a first instance, is a plasma reactor chamber 10 having incorporated therein a plasma electrode 15 and a platen 11. Similarly, there is also shown within the schematic diagram of FIG. 1 positioned upon the platen 11 a microelectronic fabrication 13.

Within the preferred embodiment of the present invention with respect to each of the plasma reactor chamber 10, the plasma electrode 15 and the platen 11, each of the plasma reactor chamber 10, the plasma electrode 15 and the platen 11 is formed of configuration and material as are otherwise conventional in the art of microelectronic fabrication.

Similarly, each of the plasma reactor chamber 10, the plasma electrode 15 and the platen 11 is sized appropriately to the microelectronic fabrication 13 which is positioned upon the platen 11.

Within the preferred embodiment of the present invention with respect to the microelectronic fabrication 13, the microelectronic fabrication 13 in a first instance will typically and preferably comprise a substrate, where the substrate may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Similarly, although also not specifically illustrated within the schematic diagram of FIG. 1, the microelectronic fabrication 13 may comprise the substrate alone as employed within the microelectronic fabrication 13, or in the alternative, the microelectronic fabrication may comprise the substrate as is employed within the microelectronic fabrication, where the substrate has formed thereupon and/or thereover any of several additional microelectronic layers as are conventional within the microelectronic fabrication within which is employed the substrate. Similarly with the substrate alone as employed within the microelectronic fabrication, such additional microelectronic layers may include, but are not limited to microelectronic conductor layers, microelectronic semiconductor layers and microelectronic dielectric layers.

Within the preferred embodiment of the present invention, an upper surface of the microelectronic fabrication 13 which is etched within the plasma reactor chamber 10 within the plasma reactor apparatus whose schematic diagram is illustrated in FIG. 1 is typically and preferably formed of a silicon material. Such a silicon material may be selected from the group including but not limited to amorphous silicon materials, polycrystalline silicon materials, monocrystalline silicon materials and polycide materials. Similarly, the silicon material may comprise only the substrate employed within the microelectronic fabrication 13 (i.e. typically a monocrystalline silicon semiconductor substrate), or in the alternative the silicon material may comprise an upper lying silicon material layer formed over the substrate employed within the microelectronic fabrication (i.e. typically a polycrystalline silicon layer formed over the substrate). Typically and preferably, the silicon material will be masked while employing at least either of a patterned photoresist layer etch mask layer or a patterned hard mask layer etch mask layer, to provide for selective etching of the silicon material within a plasma formed employing the plasma electrode 15 within the plasma reactor chamber 10.

Within the preferred embodiment of the present invention, when an upper surface of the microelectronic fabrication 13 comprises a silicon material desired to be selectively etched (such as, for example and without limitation, a selective etching of an isolation trench within a monocrystalline silicon substrate or a selective etching of a blanket polysilicon layer to form a patterned polysilicon layer), a plasma etch method which provides a plasma within the plasma reactor chamber 10 will typically and preferably employ an etchant gas composition which upon plasma activation provides at least one (and preferably both) of an active chlorine containing species and an active bromine containing species. The active chlorine containing species may be formed from plasma activation of a gas selected from the group including but not limited to chlorine and hydrogen chloride, while the active bromine containing species may be from plasma activation of a gas selected from the group including but not limited to bromine and hydrogen bromide. More typically and preferably, the plasma etch method employs an etchant gas composition comprising chlorine and hydrogen chloride.

When employed for etching a silicon material layer formed integral to or over an eight inch diameter substrate which at least in part comprises the microelectronic fabrication 13, the plasma etch method also employs: (1) a reactor chamber pressure of from about 50 to about 150 mtorr; (2) a bias power of from about 100 to about 700 watts; (3) a silicon substrate (or silicon containing layer) temperature of from about 14 to about 15 degrees centigrade; (4) a chlorine flow rate of from about 15 to about 25 standard cubic centimeters per minute (sccm); and (5) a hydrogen bromide flow rate of from about 80 to about 120 standard cubic centimeters per minute (sccm).

Shown also within the schematic diagram of FIG. 1 is a substrate transfer buffer chamber 12 interposed between the plasma reactor chamber 10 and a load lock chamber 18. As is illustrated within the schematic diagram of FIG. 1, the substrate transfer buffer chamber 12 has incorporated therein a substrate transfer assembly 14 which provides for transfer of a substrate through both: (1) a first substrate transfer window 16a which provides for communication between the plasma reactor chamber 10 and the substrate transfer buffer chamber 12, as well as; (2) a second substrate transfer window 16b which provides for communication between the substrate transfer buffer chamber 12 and the load lock chamber 18. Although not specifically illustrated within the schematic diagram of FIG. 1, each of the first substrate transfer window 16a and the second substrate transfer window 16b is independently shuttered such that there may be maintained at all times a constant and low vacuum pressure within the plasma reactor chamber 10.

Similarly with the plasma reactor chamber 10, the substrate transfer buffer chamber 12 and the substrate transfer assembly 14 may also be fabricated employing methods and configurations are conventional in the art of microelectronic fabrication, while similarly being sized appropriately for the efficient and effective transfer of the microelectronic fabrication 13 through the substrate transfer buffer chamber 12.

Within the preferred embodiment of the present invention with respect to the load lock chamber 18, the load lock chamber 18 has incorporated therein an elevator 20 upon which is positioned a substrate cassette 22 which is progressively filled with microelectronic fabrications which have been processed within the plasma reactor chamber 10 and subsequently transferred into the substrate cassette 22 via transfer through the substrate transfer buffer chamber 12 while employing the substrate transfer assembly 14.

Finally, there is shown within the schematic diagram of FIG. 1 a two part cassette transfer chamber 24 which adjoins the load lock chamber 18 and which accesses the load lock chamber 18 through a third window (not shown) which is covered by a movable shutter 26. A first portion 24a of the cassette transfer chamber 24 is integral to and stationary with the load lock chamber 18, while a second portion 24b of the cassette transfer chamber 24 is movably appended to the first portion 24a of the cassette transfer chamber 24 in a fashion such that there may be provided additional access to the cassette 22 when extracted from the load lock chamber 18 through the third window.

The present invention provides that there is incorporated into each of the load lock chamber 18, the first portion 24a of the cassette transfer chamber 24 and the second portion 24b of the cassette transfer chamber 24 a series of purge gas ports 28a, 28b and 28c which provide for a complete inert gas purging of the load lock chamber 18, the first portion 24a of the cassette transfer chamber 24, the second portion 24b of the cassette transfer chamber 24 and the substrate cassette 22 having accumulated therein a series of microelectronic fabrications 13 which have been plasma etched, at a point in time when a high vacuum within the load lock chamber 18 is released in order to access the substrate cassette 22 having accumulated therein the series of microelectronic fabrications 13 and remove the substrate cassette 22 having accumulated therein the series of microelectronic fabrications 13 from the load lock chamber 18. It has been determined experimentally that such a continuous purge of an inert purge gas PG provides for a significant attenuation in residue, and in particular a significant attenuation in particulate contamination residue, deposited upon the microelectronic fabrications 13 accumulated within the substrate cassette 22 within the load lock chamber 18 when removing from the load lock chamber the substrate cassette 22 having accumulated therein the microelectronic fabrications 13.

Within the present invention and the preferred embodiment of the present invention, the inert purge gas PG which may be introduced into the load lock chamber 18, and preferably but optionally also within the first portion 24a of the cassette transfer chamber 24 and the second portion 24b of the cassette transfer chamber 24, may be selected from the group of purge gases including but not limited to nitrogen, argon, helium or mixtures thereof, although nitrogen is typically preferred for use as a purge gas within the context of the present invention, for economic reasons. Similarly, within the present invention and the preferred embodiment of the present invention the inert purge gas PG has a low and controlled moisture level, preferably of less than about 20 ppt and more preferably of less than about 1.0 ppt and most preferably of less than about 0.1 ppt and it is employed at a pressure of from about 60 to about 80 pounds per square inch (psi), for a time period of from about 4 to about 6 minutes. Similarly, the inert purge gas PG also has a halide contents such as, but not limited to a hydrogen bromide halide content, of less than about 10 ppm.

Notable within the present invention is that the attenuation of residues formed upon microelectronic fabrications 13 accumulated within the substrate cassette 22 incident to employing the purge with the purge gas PG through each of the purge gas ports 28a, 28b and 28c prior to removing the substrate cassette 22 from the load lock chamber 18 preferably neither employs nor requires a subsequent evacuation of the load lock chamber 18 to provide optimal value of the purge with the purge gas PG. Similarly, also notable within the present invention is that the attenuation of residues deposited upon microelectronic fabrications 13 within the substrate cassette 22 incident to employing the purge with the purge gas PG through each of the purge gas ports 28a, 28b and 28c employs an inert purge gas PG without an oxidizing gas in conjunction with the inert gas, and also in absence of a plasma when employing the purge gas PG which is an inert gas and an effectively moisture free gas, in absence of the oxidizing gas.

While not wishing to be bound to a particular theory of operation of the present invention, it is believed within the context of the preferred embodiment of the present invention when etching a silicon containing material layer within a microelectronic fabrication while employing a chlorine containing and/or bromine containing etchant gas composition that there is formed upon sidewall portions of the etched silicon containing layer a passivating residue layer which comprises components of silicon, chlorine and/or bromine, and possibly also oxygen. It is further believed that upon exposure of this passivating residue layer to ambient moisture incident to venting a plasma reactor chamber or a load lock chamber in absence of the low moisture content inert gas purge in accord with the present invention that the passivating residue layer decomposes to provide a free acid vapor of either or both hydrochloric acid and hydrobromic acid, along within a powdery silicon and oxygen residue which redistributes as an undesirable particulate residue upon the microelectronic fabrication.

EXAMPLES

There was obtained two series of (100) silicon semiconductor substrates which had formed thereupon a series of patterned silicon nitride layers which served as a series of etch mask layers for forming a series of shallow isolation trenches within the two series of (100) silicon semiconductor substrates. The two series of patterned silicon nitride layers in turn defined a series of apertures of bi-directional aperture width from about 0.15 to about 0.2 microns which left exposed portions of the two series of (100) silicon semiconductor substrates into which were to be etched the series of isolation trenches.

A first series of the two series of silicon semiconductor substrates was then etched to form the series of isolation trenches formed therein while employing a plasma etch method within a plasma reactor chamber while employing an etchant gas composition comprising chlorine and hydrogen bromide. The plasma etch method also employed: (1) a reactor chamber pressure of about 100 mtorr; (2) a bias power of about 700 watts; (3) a semiconductor substrate temperature of about 15 degrees centigrade; (4) a chlorine flow rate of about 20 standard cubic centimeters per minute (sccm); and (5) a hydrogen bromide flow rate of about 100 standard cubic centimeters per minute (sccm).

The first series of silicon semiconductor substrates was etched in a single wafer mode in the plasma reactor chamber within a plasma etch apparatus of configuration analogous to the configuration of the plasma etch apparatus whose schematic diagram is illustrated in FIG. 1. Similarly, each silicon semiconductor substrate, once etched, was transferred to a substrate cassette within a load lock chamber within the plasma reactor apparatus. Upon filling of the substrate cassette with a total of 24 silicon semiconductor substrates, the load lock chamber was vented to atmosphere and the substrate cassette was removed.

The second series of silicon semiconductor substrates was treated otherwise equivalently with the first series of semiconductor substrates, with the exception that rather than venting the load lock chamber to atmosphere incident to removing the substrate cassette from the load lock chamber, the load lock chamber was instead vented and purged with nitrogen gas having a moisture content of less than about 10 ppt and a purge pressure of about 80 pounds per square inch (psi) for a time period of about 5 minutes prior to removing the substrate cassette filled with a total of 24 silicon semiconductor substrates from the load lock chamber.

Samples from each of the two series of silicon semiconductor substrates within each of the two cassettes were then obtained and measurements of surface particulate residue were obtained while employing light scattering methods as are conventional in the art of microelectronic fabrication.

Results of the light scattering measurements are presented in Table I, as below.

TABLE I

Particles Per Wafer

With Atmospheric Venting 500+/−100
With Dry N2 Venting and Dry N2 Purge 10+/−5

As is seen from review of the data within Table I, by employing a dry nitrogen venting and a dry nitrogen purging of a load lock chamber in accord with the preferred embodiment of the present invention, there is provided a significant decrease in particulate residue deposited upon a silicon semiconductor substrate within a substrate cassette positioned within the load lock chamber than is observed for an equivalent series of silicon semiconductor substrates within an equivalent substrate cassette when venting the load lock chamber directly with an ambient atmosphere.

As is understood by a person skilled in the art, the preferred embodiment and examples of the present invention are illustrative of the present invention rather than limiting of the present invention. Revisions and modifications may be made to materials, structures and dimensions through which is practiced the preferred embodiment and examples of the present invention while still providing embodiments and examples of the present invention, in accord with the appended claims.

What is claimed is:

1. A method for forming a plasma etched layer comprising:
   providing a substrate;
   forming over the substrate a microelectronic layer;
   etching within a plasma reactor chamber, and while employing a plasma etch method, the microelectronic layer to form a plasma etched microelectronic layer;
   transferring the substrate having formed thereover the plasma etched microelectronic layer to a load lock chamber which is integral with the plasma reactor chamber; and
   purging the load lock chamber with an inert purge gas, without subsequently evacuating the load lock chamber, prior to removing the substrate having formed thereover the plasma etched layer from the load lock chamber.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the microelectronic layer is selected from the group consisting of microelectronic conductor layers, microelectronic semiconductor layers and microelectronic dielectric layers.

4. The method of claim 1 wherein the microelectronic layer is a silicon containing microelectronic layer selected from the group consisting of amorphous silicon layers, polycrystalline silicon layers, monocrystalline silicon layers and polycide layers.

5. The method of claim 4 wherein the plasma etch method employs an etchant gas selected from the group consisting of chlorine containing etchant gases and bromine containing etchant gases.

6. The method of claim 1 wherein the inert purge gas is selected from the group consisting of nitrogen, argon and helium having a moisture content of less than about 20 ppt.

7. The method of claim 1 wherein the inert purge gas does not include an oxidizing gas.

8. The method of claim 7 wherein when purging the plasma reactor chamber with the inert purge gas which does not include the oxidizing gas there is not employed a plasma activation of the inert purge gas which does not include the oxidizing gas.

* * * * *